United States Patent
Funakawa

(12) 
(10) Patent No.: US 6,343,091 B1
(45) Date of Patent: Jan. 29, 2002

(54) EXTERNAL RESONATOR LIGHT SOURCE

(75) Inventor: Seiji Funakawa, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/160,442

(22) Filed: Sep. 25, 1998

(30) Foreign Application Priority Data

Sep. 26, 1997 (JP) .............................................. 9-262561

(51) Int. Cl.$^7$ ................................................. H10S 3/08
(52) U.S. Cl. ............................ 372/99; 372/99; 372/32; 372/20; 372/92
(58) Field of Search ............................ 372/99, 92, 20, 372/32; 359/333, 346

(56) References Cited

U.S. PATENT DOCUMENTS

| | | | | |
|---|---|---|---|---|
| 3,907,430 A | * | 9/1975 | Mann ......................... | 356/332 |
| 4,494,235 A | * | 1/1985 | Guch, Jr et al. .............. | 372/23 |
| 4,912,526 A | * | 3/1990 | Iwaoka et al. .............. | 359/181 |
| 5,068,546 A | * | 11/1991 | Hemmerich et al. ........ | 359/328 |
| 5,121,398 A | | 6/1992 | Rao | |
| 5,491,714 A | * | 2/1996 | Kitamura ...................... | 372/92 |
| 5,493,575 A | * | 2/1996 | Kitamura ...................... | 372/20 |
| 5,548,609 A | * | 8/1996 | Kitamura ...................... | 372/92 |
| 5,570,226 A | * | 10/1996 | Ota ............................. | 359/333 |
| 5,594,745 A | * | 1/1997 | Oka ............................. | 372/21 |
| 5,684,623 A | * | 11/1997 | King et al. ................. | 359/346 |
| 5,809,048 A | * | 9/1998 | Shichijyo et al. ............ | 372/32 |
| 5,838,426 A | * | 11/1998 | Shinonaga et al. ........... | 355/52 |
| 5,862,162 A | * | 1/1999 | Maeda ......................... | 372/20 |
| 5,912,910 A | * | 6/1999 | Sanders et al. ................ | 372/22 |
| 5,970,076 A | * | 10/1999 | Hamada ....................... | 372/20 |
| 5,974,060 A | * | 10/1999 | Byren et al. .................. | 372/19 |

FOREIGN PATENT DOCUMENTS

| | | |
|---|---|---|
| DE | 29607659 | 10/1996 |
| EP | 0718936 | 6/1996 |
| JP | 55-141779 | 11/1980 |
| JP | 9-129982 | 5/1997 |

OTHER PUBLICATIONS

W.F. Sharfin, "Lateral–Mode selectivity in esternal cavity diode laser with residual facet reflectivity", IEEE Journal of Quantum electronics, vol. 26, No. 10, Oct. 1990, p. 1756–1763.*

Gavrilovic, P. et al., "Narrow–Linewidth Operation of Broad–Stripe Single Quantum Well Laser Diodes in a Grazing Incidence External Cavity", Applied Physics Letters, vol. 60, No. 24, Jun. 15, 1992, pp. 2977–2979.

Bernacki, B.E. et al., "Alignment–Insensitive Technique for Wideband Tuning of an Unmodified Semiconductor Laser," 2412, Optics Letters, vol. 13, No. 9, Sep. 1988, pp. 725–727.

* cited by examiner

*Primary Examiner*—Frank G. Font
*Assistant Examiner*—Delma R. Flores Ruiz
(74) *Attorney, Agent, or Firm*—Finnegan, Henderson, Farabow, Garrett, & Dunner L.L.P.

(57) ABSTRACT

The present invention provides an external resonator light source which, by removing natural emitted light, is able to send out only light which has an extremely high wavelength purity. As shown in FIG. 1, the present invention's external resonator light source is provided with a light amplifying element 21; a first light reflecting means 22 disposed to the side of one outgoing light edge surface 21a of the light amplifying element 21; a wavelength selecting element 23 disposed to the side of the other outgoing light edge surface 21b of the light amplifying element 21; and a second light reflecting means 24 which reflects and/or transmits outgoing light 31a from the wavelength selecting element 23, and which, together with the first light reflecting means 22, forms a light resonator; wherein outgoing light from the wavelength selecting element 23 is output as transmitted light 32 from the second light reflecting means 24.

17 Claims, 3 Drawing Sheets

EXTERNAL RESONATOR LIGHT SOURCE

BACKGROUND OF THE INVENTION

1. Field of the Invention

This application is based on patent application No. Hei 09-262561 filed in Japan, the content of which is incorporated herein by reference.

2. Description of the Related Art

FIG. 5 is a schematic structural diagram showing a conventional external resonator light source. In this figure, the numeral 1 indicates a semiconductor laser having two edge surfaces 1a,1b, wherein edge surface 1a is the reflecting surface and edge surface 1b has a coating to prevent reflection formed thereto; 2 is a diffraction grating provided to the side of edge surface 1b of semiconductor laser 1; 3 is a total reflecting lens which is provided perpendicular to light having the desired wavelength from among the light which is outgoing from diffraction grating 2, total reflecting mirror 3 reflecting this outgoing light and returning it to its source; 4 is an optical fiber provided to the side of edge surface 1a of semiconductor laser 1; 5 is a collimator lens provided between semiconductor laser 1 and diffraction grating 2; and 6 is a condenser provided between semiconductor laser 1 and optical fiber 4.

Of the light 7 generated in semiconductor laser 1, a portion of the light traveling to the edge surface 1a side of semiconductor laser 1 is reflected by edge surface 1a to become reflected light, while light which is not thus reflected passes through edge surface 1a.

Conversely, of the light 7 generated in semiconductor laser 1, light 10, consisting of light traveling toward the edge surface 1b side of semiconductor laser 1 and the aforementioned reflected light, is not reflected by the antireflection film formed to edge surface 1b, but is outgoing from semiconductor laser 1. Collimator lens 5 then renders light 10 into parallel light, and incidents it on diffraction grating 2 so that diffraction occurs. Diffracted light 11 which has been diffracted by diffraction grating 2 is then dispersed at each wavelength, and travels out from diffraction grating 2.

Total reflecting mirror 3 is disposed so as to be perpendicular only to light having the desired wavelength from among diffracted light 11. Thus, light of the desired wavelength which is reflected by total reflecting mirror 3 returns along the same light path, is reflected by diffraction grating 2, and then passes through semiconductor laser 1 to again undergo reflection and transmission at edge surface 1a of semiconductor laser 1.

The wavelength oscillated by the laser at this time is determined according to an angle α, formed by normal 12 of diffraction grating 2 and the light 10 that incidents on diffraction grating 2 from the semiconductor laser 1 side, and an angle β, formed by normal 12 of diffraction grating 2 and the light 13 that reincidents on the diffraction grating 2 from the total reflecting mirror 3 side.

In this way, a laser oscillation occurs in light 7 generated in semiconductor laser 1, by means of the resonator formed by edge surface 1a of semiconductor laser 1 and total reflecting mirror 3. The output of this laser oscillation is then output to the outside via edge surface 1a. Light 14 output to the outside via edge surface 1a of semiconductor laser 1 is condensed at condenser 6, incidents on optical fiber 4, and is then employed as a signal light.

However, conventional external resonator light sources are problematic in that laser light having the wavelength selected by a wavelength selecting element and light which is naturally emitted from the light amplifying element are output simultaneously. Thus, laser light 17 and natural emitted light 18 are simultaneously output as shown in FIG. 6, resulting in a deterioration in the purity of the wavelength of the light source.

For example, in the above described semiconductor laser 1, light 14 output to the outside via edge surface 1a includes both the laser light and natural emitted light generated inside semiconductor laser 1. As a result, it is typically the case that both laser light 17 and natural emitted light 18 are simultaneously measured in the light outgoing from an external resonator light source.

When an element other than a semiconductor laser is employed for the light amplifying element, a method may be employed in which laser oscillation is carried out by resonating the light generated from the light amplifying element using two reflecting surfaces. However, even in this case, natural emitted light generated by the light amplifying element is simultaneously measured, in addition to the light subjected to laser oscillation through selective oscillation by the wavelength selecting element.

Accordingly, as is the conventional practice, when employing a method in which the light directly emitted from the light amplifying element is output, both laser light and natural emitted light are simultaneously measured in the signal light. As a result, it has not been possible to avoid a deterioration in the wavelength purity of the light source.

SUMMARY OF THE INVENTION

The present invention was conceived in consideration of the above-described circumstances, and has as its objective the provision of an external resonator light source which, by removing natural emitted light, is able to send out only light which has an extremely high wavelength purity.

In order to resolve the problems described above, the present invention employs an external resonator light source of the following design.

Namely, the external resonator light source according to claim 1 is provided with a light amplifying element; a first light reflecting means disposed on one of the sides of the light amplifying element from which outgoing beams are emitted; a wavelength selecting element disposed on the other side of the light amplifying element from which outgoing beams are emitted; and a second light reflecting means which reflects and/or transmits outgoing light from the wavelength selecting element, and which, together with the first light reflecting means, forms a light resonator. This external resonator light source according to claim 1 employs the second light reflecting means to output outgoing light from the wavelength selecting element as transmitted light.

The external resonator light source is provided with a light coupling means on the light transmission side of the second light reflecting means for incidenting the transmitted light on the path of light transmission.

The external resonator light source is designed such that the first reflecting means serves as a reflecting surface provided on one of the edge surfaces of the light amplifying element from which outgoing beams are emitted.

Additionally, in this external resonator light source, the reflection coefficient of the first light reflecting means is set to be higher than the reflection coefficient of the second light reflecting means.

In the external resonator light source, the wavelength selecting element may be a diffraction grating.

In the external resonator light source, the wavelength selecting element may be a wavelength varying filter.

In the external resonator light source, the path of light transmission is either an optical fiber or an optical waveguide.

The present invention's external resonator light source is provided with a light amplifying element; a first light reflecting means disposed on one of the sides of the light amplifying element from which outgoing beams are emitted; a wavelength selecting element disposed on the other side of the light amplifying element from which outgoing beams are emitted; and a second light reflecting means which reflects and/or transmits outgoing light from the wavelength selecting element, and which, together with the first light reflecting means, forms a light resonator; wherein light outgoing from the wavelength selecting element is output as transmitted light from the second light reflecting means. As a result, natural emitted light generated from the light amplifying element is removed by the wavelength selecting element, so that only light of the desired wavelength passes out therefrom, and only light of the desired wavelength which has been selected by the wavelength selecting element is transmitted from the second light reflecting means to be output as transmitted light. Thus, natural emitted light is removed, making it possible to send out light of the desired wavelength having an extremely high wavelength purity.

In the present invention's external resonator light source, the first light reflecting means may have a high reflection coefficient, however, the reflection coefficient of the second light reflecting means is set low enough so that light of the desired wavelength selected by the wavelength selecting element is transmitted. In other words, it is desirable to set the reflection coefficient of the second light reflecting means to be lower than the reflection coefficient of the first light reflecting means.

This results in reduced loss in the light resonator formed by the first and second light reflecting means, making it possible to achieve a large light output with respect to the transmitted light.

DESCRIPTION OF THE PREFERRED EMBODIMENTS

The present invention's external resonator light source will now be explained based on the accompanying figures.

EMBODIMENT 1

Figure 1:
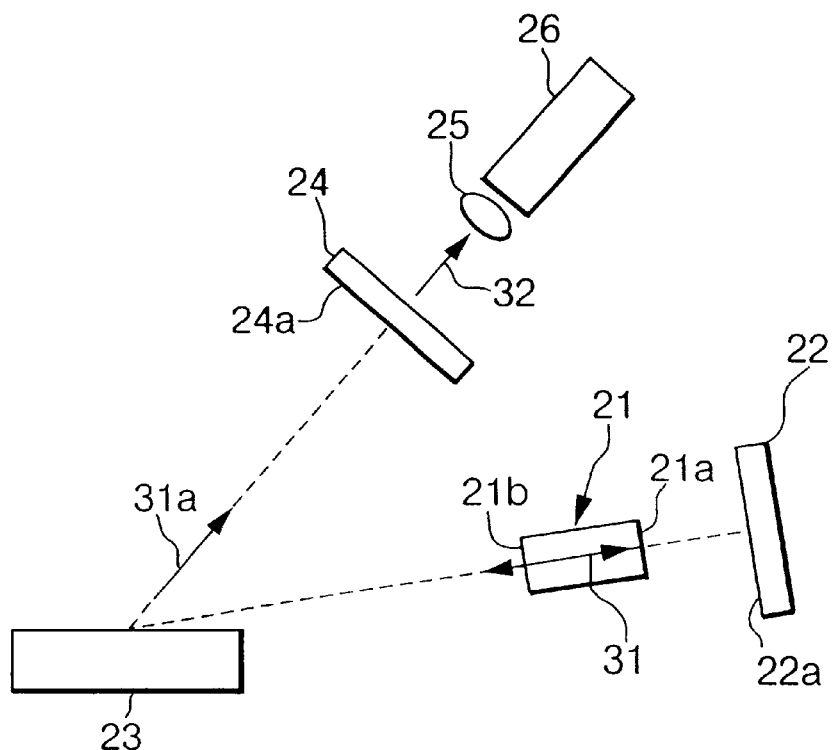
FIG. 1 is a structural diagram showing an external resonator light source according to a first embodiment of the present invention.

FIG. 1 is a structural diagram showing the external resonator light source according the first embodiment of the present invention. In this figure, 21 is a light amplifying element; 22 is a first reflecting mirror (first light reflecting means) having a first reflecting surface 22a disposed on the outgoing light edge surface 21a side of light amplifying element 21; 23 is a wavelength selecting element disposed on the other outgoing light edge surface 21b side of light amplifying element 21; 24 is a second reflecting mirror (second light reflecting means) which reflects and/or transmits outgoing light from wavelength selecting element 23, and which, together with the first reflecting lens 22, forms a light resonator; 25 is a light coupling means provided on the side of second reflecting lens 24 through which light is transmitted; and 26 is the light transmission path on which light transmitted from light coupling means 25 incidents.

A semiconductor laser in which antireflection films have been formed to both edge surfaces 21a,21b is suitably employed as the light amplifying element 21.

A diffraction grating, a condensing lens, and either an optical fiber or an optical waveguide, are suitably employed for wavelength selecting element 23, light coupling means 25, and light transmission path 26, respectively.

The reflection coefficient of first reflecting surface 22a is set to be higher than the reflection coefficient of second reflecting surface 24a.

In this external resonator light source, a portion of the light 31 generated in light amplifying element 21 progresses from edge surface 21a toward first reflecting surface 22a, and is reflected by this first reflecting surface 22a. The direction of light progression undergoes a 180° change, and the light again incidents via edge surface 21a onto light amplifying element 21. The light receives a gain as it passes through light amplifying element 21, is sent out from edge surface 21b, and incidents on wavelength selecting element 23.

The remainder of the light 31 generated in light amplifying element 21 travels out from edge surface 21b, and directly incidents on wavelength selecting element 23.

Of the light 31 that incidents on wavelength selecting element 23, only light 31a of the desired wavelength is selected, and only this selected desired light 31a travels out toward second reflecting surface 24a.

Second reflecting surface 24a is disposed so as to be perpendicular with respect to light 31 of the desired wavelength from among the light traveling out from wavelength selecting element 23. Accordingly, a portion of light 31a of the desired wavelength that is traveling out from wavelength selecting element 23 is reflected by second reflecting surface 24a and again incidents on wavelength selecting element 23, while the remainder of the light passes through second reflecting lens 24 to become transmitted light 32.

Once again only light of the desired wavelength Is selected from among the light that reincidents on wavelength selecting element 23, and only this selected desired light travels out from wavelength selecting element 23 to incident on light amplifying element 21.

After being amplified again, the light that incidents on light amplifying element 21 progresses from edge surface 21atoward first reflecting surface 22a, and incidents on first reflecting surface 22a.

In this way, the light subjected to wavelength selection at wavelength selecting element 23 receives a gain from light amplifying element 21 and undergoes laser oscillation by the light resonator formed by first reflecting surface 22a and second reflecting surface 24a.

Figure 6:
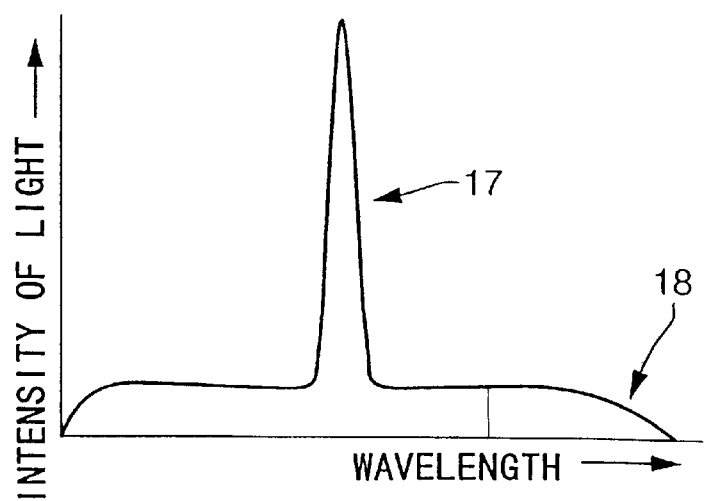
FIG. 6 is a graph showing the relationship between light output and the wavelength of the light amplifying element.

In addition to laser light of the desired wavelength, light which is emitted naturally in proportion to the gain from light amplifying element 21 is emitted in light amplifying element 21. As a result, as shown in FIG. 6, natural emitted light 18 proportional to the gain from light amplifying element 21 is measured at the same time as laser light 17.

Figure 2:
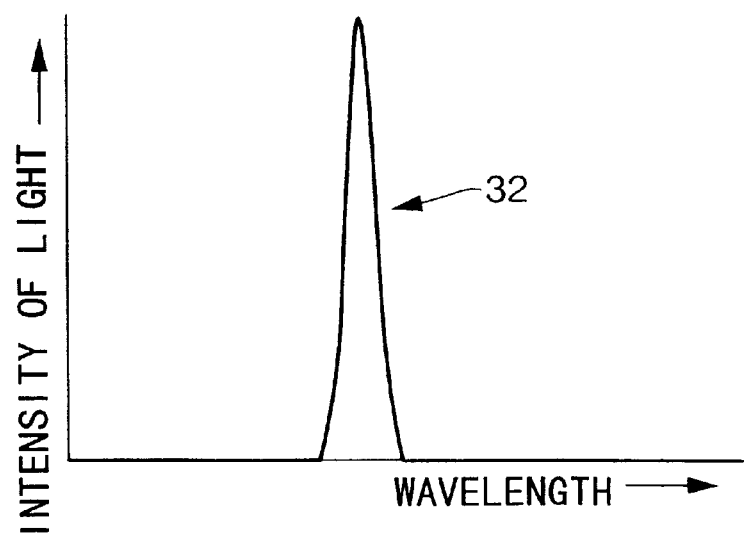
FIG. 2 is a graph showing the relationship between light output and the wavelength of light transmitted from the second reflecting lens of the external resonator light source according to the first embodiment of the present invention.

On the other hand, as shown in FIG. 2, transmitted light 32 from second reflecting lens 24 is light from which the natural emitted light traveling out from light amplifying element 21 has been removed. This transmitted light 32 is condensed by light coupling means 25 and incidents on light transmission path 26.

The external resonator light source according to claim 1 is provided with a light amplifying element 21; a first reflecting mirror 22 having a first reflecting surface 22a disposed to one outgoing light edge surface 21a side of light amplifying element 21; a wavelength selecting element 23 disposed to the other outgoing light edge surface 21b side of light amplifying element 21; and a second reflecting mirror 24 which reflects and/or transmits outgoing light from the wavelength selecting element 23, and which, together with the first reflecting lens 22, forms a light resonator; wherein transmitted light 32 from the second reflecting lens 24 is output. Transmitted light 32 in which only light of the desired wavelength has been selected is employed as a signal light; thus, natural emitted light has been removed, making it possible to obtain a signal light having only laser light of the desired wavelength.

By setting the reflection coefficient of first reflecting surface 22a to be higher than the reflection coefficient of the second reflecting surface 24a, loss in the light resonator formed from first reflecting surface 22a and second reflecting surface 24a is reduced. As a result, it is possible to obtain a large light output for transmitted light 32.

EMBODIMENT 2

Figure 3:
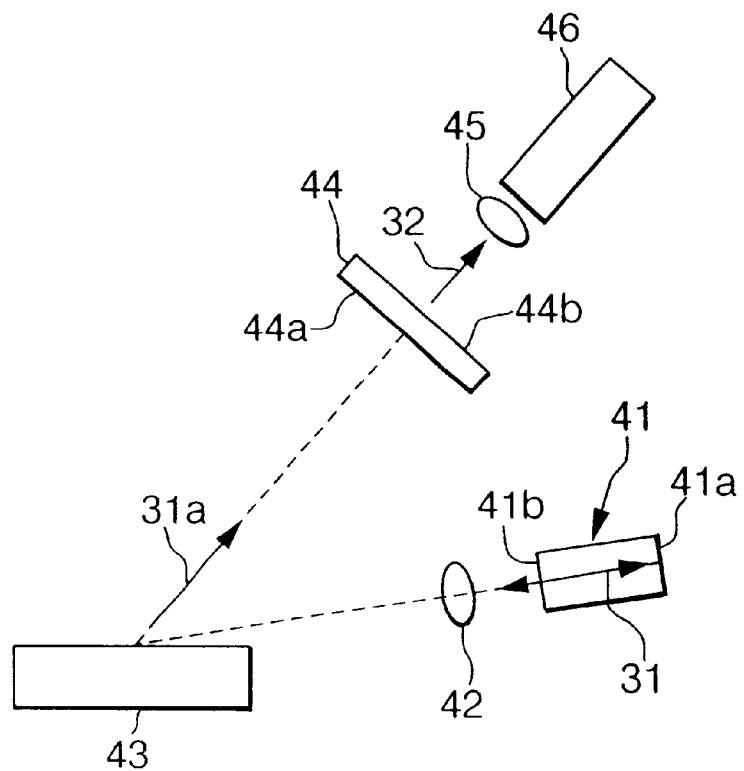
FIG. 3 is a structural diagram showing the external resonator light source according to a second embodiment of the present invention.

FIG. 3 is a structural diagram showing an external resonator light source according to a second embodiment of the present invention. In this figure, 41 is a semiconductor laser (light amplifying element); 42 is a collimator lens; 43 is a diffraction grating (wavelength selecting element); 44 is a reflecting mirror (second light reflecting means); 45 is a condensing lens (light coupling means); and 46 is an optical fiber (light transmission path).

A semiconductor laser having a gain in the region of 1.550 μm is suitably employed for semiconductor laser 41. One edge surface of this semiconductor laser 41 forms a reflecting surface 41a (first light reflecting means) having a reflection rate of approximately 20% obtained by wall openings, while a antireflection film is formed to the other edge surface 41b.

A holographic grating having 900 grooves/mm and a blazed wavelength of 1000 nm is suitably employed for diffraction grating 43.

Reflecting mirror 44 is a reflecting lens having a reflection coefficient of 50% or less. A antireflection film is formed to surface 44b which is parallel to reflecting surface 44a.

Reflecting surface 41a and reflecting surface 44a of reflecting mirror 44 are disposed so as to form a light resonator.

Of the light 31 generated by semiconductor laser 41 in this external resonator light source, the light traveling toward the reflecting surface 41a side is reflected by reflecting surface 41a and then travels toward edge surface 41b. On the other hand, light traveling toward edge surface 41b is not reflected, but travels out from edge surface 41b along with the light reflected at reflecting surface 41a.

The light 31 outgoing from semiconductor laser 41 is formed into parallel light at collimator lens 42, and incidents on diffraction grating 43.

Since the light that incidents on diffraction grating 43 is diffracted and travels out, it has a different dispersion angle at each wavelength.

Reflecting surface 44a of reflecting mirror 44 is disposed so as to be perpendicular only to light 31a of the desired wavelength from among the light that is diffracted by diffraction grating 43. As a result, only light 31a of the desired wavelength incidents on diffraction grating 43 as a result of following the same locus.

Light of the desired wavelength which incidents again on diffraction grating 43 is diffracted again by diffraction grating 43, condensed at collimator lens 42, incidents on semiconductor laser 41, and is then reflected by reflecting surface 41a while being once more amplified by semiconductor laser 41.

In this way, laser oscillation occurs in light of the desired wavelength due to the gain from semiconductor laser 41 and the light resonator formed by reflecting surface 41a of semiconductor laser 41 and reflecting surface 44a of reflecting mirror 44.

In addition to laser light 31a of the desired wavelength, light naturally emitted in proportion to the gain from the semiconductor laser is also emitted in semiconductor laser 41.

For this reason, with respect to the light obtained after passing through edge surface 41b, natural emitted light 18 proportional to the gain from semiconductor laser 41 is measured simultaneously with laser light 17, as shown in FIG. 6.

Since the wavelength of transmitted light 32 from reflecting mirror 44 Is dispersed by diffraction grating 43, natural emitted light output from semiconductor laser 41 is also dispersed at each wavelength by diffraction grating 43.

As shown in FIG. 2, natural emitted light is removed from transmitted light 32 which incidents perpendicular to and passes through reflecting surface 44a of reflecting mirror 44. This transmitted light 32 is condensed at lens 45, and incidents on optical fiber 46.

The external resonator light source according to the second embodiment of the present invention is provided with a semiconductor laser 41; diffraction grating 43 disposed to the side of outgoing light edge surface 41b of semiconductor laser 41; and a reflecting mirror 44 which reflects and/or transmits outgoing light 31 from diffraction grating 43, and which, together with reflecting surface 41a of semiconductor laser 41, forms a light resonator; wherein transmitted light 32 from reflecting mirror 44 is output. As a result, transmitted light 32 in which only light of the desired wavelength is selected is employed as a signal light. Thus, it is possible to obtain a signal light from which natural emitted light has been removed so that only laser light of the desired wavelength is present.

By increasing the reflection coefficient of edge surface 41a of semiconductor laser 41, loss in the light resonator formed from edge surface 41a and reflecting surface 44a of reflecting mirror 44 is reduced. As a result, it is possible to obtain a large light output for transmitted light 32.

EMBODIMENT 3

Figure 4:
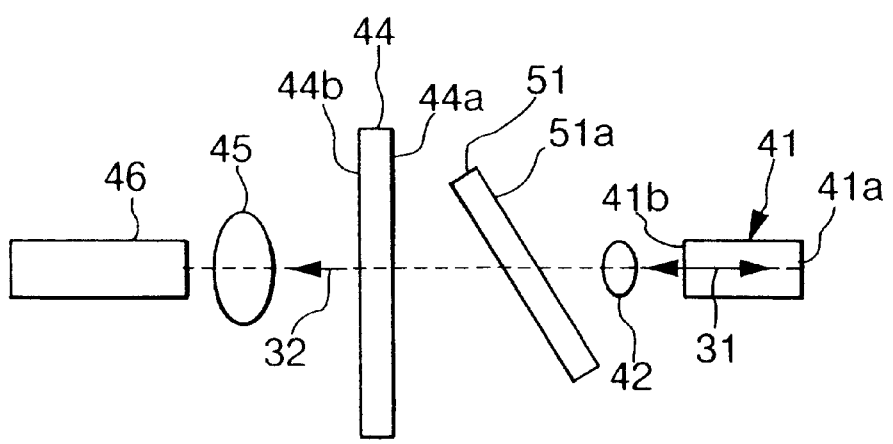
FIG. 4 is a structural diagram showing the external resonator light source according to a third embodiment of the present invention.
Figure 5:
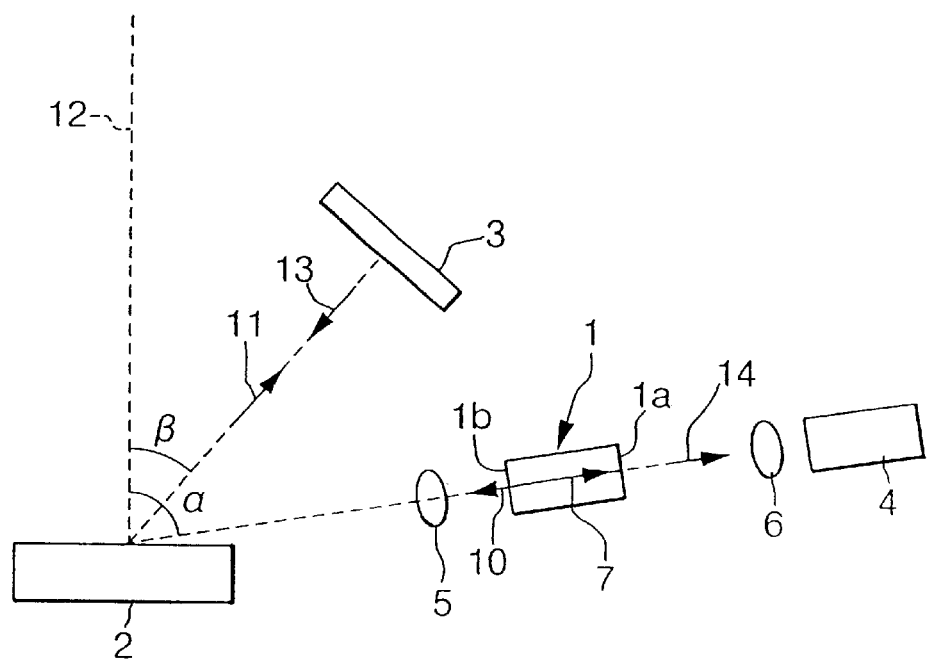
FIG. 5 is a structural diagram showing a conventional external resonator light source.

FIG. 4 is a structural diagram showing the external resonator light source according to a third embodiment of the present invention. In the figure, 51 is a wavelength varying filter (wavelength selecting element) in which the wavelength of the transmitted light varies as a result of changing the angle of incidenting surface 51a with respect to the optical axis.

With respect to the light 31 generated in semiconductor laser 41 in this external resonator light source, light progressing on the reflecting surface 41a side is reflected by reflecting surface 41a and travels in the direction of edge surface 41b. On the other hand, light traveling toward edge surface 41b is not reflected at edge surface 41b, but rather travels out from edge surface 41b of semiconductor laser 41 along with the light that was reflected at reflecting surface 41a and traveled toward edge surface 41b.

The light outgoing from semiconductor laser 41 is formed into parallel light at collimator lens 42, and incidents on wavelength varying filter 51.

Of the light that incidents on wavelength varying filter 51, only light having a wavelength proportional to the angle of incidence on wavelength varying filter 51 is transmitted.

Reflecting mirror 44 employs reflecting surface 44a to reflect light of the desired wavelength which has passed through wavelength varying filter 51. The light then follows the same focus to incident again on wavelength varying filter 51.

Light of the desired wavelength which incidents again on wavelength varying filter 51 passes through wavelength varying filter 51, is again condensed at collimator lens 42, incidents on semiconductor laser 41, and Is reflected by reflecting surface 41a while being amplified by semiconductor laser 41.

In this way, laser oscillation with a desired wavelength is generated due to the gain in semiconductor laser 41 and the light resonator formed by reflecting surface 41a of semiconductor laser 41 and the reflecting surface 44a of reflecting mirror 44.

In addition to laser light 17 of the desired wavelength, natural emitted light 18 proportion to the gain In semiconductor laser 41 Is also emitted In semiconductor laser 41, as shown In FIG. 6. For this reason, natural emitted light 18 proportional to the gain in semiconductor laser 41 is measured at the same time as laser light 17 in the light which is obtained after passing through edge surface 41b.

Since only light of the desired wavelength has been selected by wavelength varying filter 51 in the case of transmitted light 32 that has passed through reflecting mirror 44, natural emitted light outgoing from semiconductor laser 41 is also subjected to wavelength selection by wavelength varying filter 51. As a result, as shown in FIG. 2, natural emitted light has been removed from transmitted light 32 which has passed through reflecting mirror 44.

The transmitted light 32 obtained here is condensed by lens 45 and incidents on optical fiber 46.

As in the case of the external resonator light source of the second embodiment, in the external resonator light source according to the third embodiment, transmitted light 32 in which only laser light of the desired wavelength has been selected Is employed as the signal light. Thus, it is possible to obtain a signal light from which natural emitted light has been removed so that only laser light of the desired wavelength is present.

By Increasing the reflection coefficient of edge surface 41a of semiconductor laser 41, loss in the light resonator formed from edge surface 41a and reflecting surface 44a of reflecting mirror 44 is reduced. As a result, it is possible to obtain a large light output for transmitted light 32.

What is claimed:

1. An external resonator light source provided with a light amplifying element formed by semiconductor laser;
    a first light reflecting means disposed to the side of one outgoing light edge surface of the light amplifying element;
    a wavelength selecting element disposed to the side of the other outgoing light edge surface of the light amplifying element which receives light generated in the light amplifying element and selects and sends out only desired wavelength light from the incident light; and
    a second light reflecting means which reflects a portion of and transmits the remainder of outgoing light from the wavelength selecting element, and which, together with the first light reflecting means, forms a light resonator; wherein outgoing light from the wavelength selecting element is outputted as transmitted light from the second light reflecting means.

2. An external resonator light source according to claim 1, wherein a light coupling means is provided to the side of the second light reflecting means on which light is transmitted, for incidenting the transmitted light into a light transmission path.

3. An external resonator light source according to claim 1, wherein the first light reflecting means is a reflecting surface provided to one of the outgoing light edge surfaces of the light amplifying element.

4. An external resonator light source according to claim 2, wherein the first light reflecting means is a reflecting surface provided to one of the outgoing light edge surfaces of the light amplifying element.

5. An external resonator light source according to claim 1, wherein the reflection coefficient of the first light reflecting means is set to be higher than the reflection coefficient of the second light reflecting means.

6. An external resonator light source according to claim 2, wherein the reflection coefficient of the first light reflecting means is set to be higher than the reflection coefficient of the second light reflecting means.

7. An external resonator light source according to claim 3, wherein the reflection coefficient of the first light reflecting means is set to be higher than the reflection coefficient of the second light reflecting means.

8. An external resonator light source according to claim 4, wherein the reflection coefficient of the first light reflecting means is set to be higher than the reflection coefficient of the second light reflecting means.

9. An external resonator light source according to claim 1, wherein the wavelength selecting element is a diffraction grating.

10. An external resonator light source according to claim 2, wherein the wavelength selecting element is a diffraction grating.

11. An external resonator light source according to claim 3, wherein the wavelength selecting element is a diffraction grating.

12. An external resonator light source according to claim 4, wherein the wavelength selecting element is a diffraction grating.

13. An external resonator light source according to claim 1, wherein the wavelength selecting element is a wavelength varying filter.

14. An external resonator light source according to claim 2, wherein the wavelength selecting element is a wavelength varying filter.

15. An external resonator light source according to claim 3, wherein the wavelength selecting element is a wavelength varying filter.

16. An external resonator light source according to claim 4, wherein the wavelength selecting element is a wavelength varying filter.

17. An external resonator light source according to claim 2, wherein the light transmission path is either an optical fiber or an optical waveguide.

* * * * *